United States Patent
Poon et al.

(10) Patent No.: US 7,532,309 B2
(45) Date of Patent: May 12, 2009

(54) IMMERSION LITHOGRAPHY SYSTEM AND METHOD HAVING AN IMMERSION FLUID CONTAINMENT PLATE FOR SUBMERGING THE SUBSTRATE TO BE IMAGED IN IMMERSION FLUID

(75) Inventors: Alex Ka Tim Poon, San Ramon, CA (US); Leonard Wai Fung Kho, San Francisco, CA (US); Gaurav Keswani, Milpitas, CA (US); Derek Coon, Redwood City, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/523,595

(22) Filed: Sep. 20, 2006

(65) Prior Publication Data

US 2007/0279608 A1 Dec. 6, 2007

Related U.S. Application Data

(60) Provisional application No. 60/811,114, filed on Jun. 6, 2006, provisional application No. 60/837,305, filed on Aug. 14, 2006.

(51) Int. Cl.
*G03B 27/54* (2006.01)
(52) U.S. Cl. .............................. 355/67; 355/71; 378/34; 250/492.2
(58) Field of Classification Search .................. 355/53, 355/67, 72, 75, 30, 71; 378/34, 35; 250/492.2
See application file for complete search history.

(56) References Cited

U.S. PATENT DOCUMENTS

| 4,509,852 | A | 4/1985 | Tabarelli et al. |
| 5,296,891 | A | 3/1994 | Vogt et al. |
| 5,523,193 | A | 6/1996 | Nelson |
| 2005/0007569 | A1 | 1/2005 | Streefkerk et al. |
| 2005/0068499 | A1 | 3/2005 | Dodoc et al. |
| 2005/0231694 | A1 | 10/2005 | Kolesnychenko et al. |
| 2006/0023181 | A1 | 2/2006 | Novak |
| 2006/0038968 | A1 | 2/2006 | Kemper et al. |
| 2006/0087630 | A1 | 4/2006 | Kemper et al. |
| 2006/0119809 | A1 | 6/2006 | Verhagen et al. |
| 2006/0152697 | A1 | 7/2006 | Poon et al. |
| 2007/0247600 | A1* | 10/2007 | Kobayashi et al. ............ 355/30 |

FOREIGN PATENT DOCUMENTS

| EP | 0 420 299 A1 | 4/1991 |
| EP | 1 420 298 A2 | 5/2004 |

(Continued)

*Primary Examiner*—D. Rutledge
(74) *Attorney, Agent, or Firm*—Oliff & Berridge, PLC

(57) ABSTRACT

A lithography apparatus includes a fluid confinement plate which can completely submerge the imaging surface of a substrate. A gap, filled with immersion fluid, is provided between the imaging surface of the substrate and the last optical element of a projection optical system. The fluid confinement plate, which is positioned within the gap between the last optical element and the substrate, is sufficiently sized so that the imaging surface is completely submerged in the immersion fluid. The fluid confinement plate includes a first surface facing the gap and opposing the imaging surface of the substrate. The first surface includes a droplet control element to control the formation of droplets forming on the first surface.

22 Claims, 5 Drawing Sheets

FOREIGN PATENT DOCUMENTS

| | | |
|---|---|---|
| EP | 1 477 856 A1 | 11/2004 |
| EP | 1-571-695 A1 | 9/2005 |
| JP | A-2005-166776 | 6/2005 |
| WO | WO 98/33096 | 7/1998 |
| WO | WO 98/38597 | 9/1998 |
| WO | WO2004105107 * | 12/2004 |
| WO | WO 2005/024517 A2 | 3/2005 |
| WO | WO 2005/111722 A2 | 11/2005 |

* cited by examiner

IMMERSION LITHOGRAPHY SYSTEM AND METHOD HAVING AN IMMERSION FLUID CONTAINMENT PLATE FOR SUBMERGING THE SUBSTRATE TO BE IMAGED IN IMMERSION FLUID

RELATED APPLICATIONS

This application claims priority on Provisional Application Ser. No. 60/811,114 filed on Jun. 6, 2006 and entitled "Submerged-Type Immersion Lithography System" and Provisional Application Ser. No. 60/837,305 filed on Aug. 14, 2006 and entitled "Submerged-Type Immersion Lithography System", the contents of which are both incorporated herein by reference for all purposes.

BACKGROUND

1. Field of the Invention

The present invention relates to immersion lithography, and more particularly, to a fluid confinement plate on a lithography tool positioned opposite to an imaging surface of a substrate so that the substrate is submerged in the immersion fluid during exposure.

2. Related Art

A typical lithography tool includes a radiation source, a projection optical system, and a substrate stage to support and move a substrate to be imaged. A radiation-sensitive material, such as resist, is coated onto the substrate surface prior to placement onto the substrate stage. During operation, radiation energy from the radiation source is used to project an image defined by an imaging element through the projection optical system onto the substrate. The projection optical system typically includes a number of lenses. The lens or optical element closest to the substrate is often referred to as the "last" or "final" optical element.

The projection area during an exposure is typically much smaller than the imaging surface of the substrate. The substrate therefore has to be moved relative to the projection optical system to pattern the entire surface. In the semiconductor industry, two types of lithography tools are commonly used. With so-called "step and repeat" tools, the entire image pattern is projected at once in a single exposure onto a target area of the substrate. After the exposure, the wafer is moved or "stepped" in the X and/or Y direction and a new target area is exposed. This step and repeat process is performed over and over until the entire substrate surface is exposed. With scanning type lithography tools, the target area is exposed in a continuous or "scanning" motion. The imaging element is moved in one direction while the substrate is moved in either the same or the opposite direction during exposure. The substrate is then moved in the X and/or Y direction to the next scan target area. This process is repeated until all the desired areas on the substrate have all been exposed.

It should be noted that lithography tools are typically used to image or pattern semiconductor wafers and flat panel displays. The term substrate as used herein is intended to generically mean any work piece that can be patterned, including, but not limited to, semiconductor wafers and flat panel displays.

Immersion lithography systems use a layer of fluid that fills a gap between the final optical element of the projection optical system and the substrate. The fluid enhances the resolution of the system by enabling exposures with numerical apertures (NA) greater than one, which is the theoretical limit for conventional "dry" lithography. The fluid in the gap permits the exposure with radiation that would otherwise be completely internally reflected at the optical-air interface. With immersion lithography, numerical apertures as high as the index of refraction of the fluid are possible. Immersion also increases the depth of focus for a given NA, which is the tolerable error in the vertical position of the substrate, compared to a conventional dry lithography system. Immersion lithography thus has the ability to provide greater resolution than can be performed using conventional dry lithography.

In immersion systems, the fluid essentially becomes part of the optical system of the lithography tool. The optical properties of the fluid therefore must be carefully controlled. The optical properties of the fluid are influenced by the composition of the fluid, temperature, the absence or presence of gas bubbles, and out-gassing from the resist on the wafer.

One known way of maintaining the immersion fluid in the gap where exposure of the substrate is to occur is the use of an air curtain. With an air curtain design, an immersion element, with air jets, surrounds the last optical element of the projection optical system. The air jets are used to create a curtain of air surrounding the exposure area, maintaining the fluid localized within the gap under the last optical element. A number of disadvantages are associated with air curtain type immersion lithography tools. The air jets tend to cause a relatively large amount of evaporation of the immersion fluid at the air-fluid interface. As the fluid evaporates, it may cause the surface temperature of the substrate to cool, causing localized deformation of the imaging surface. The evaporation can also cause contaminants to be left behind on the surface of the substrate. The air jets also have a tendency to create air bubbles in the immersion fluid. Contaminants, air bubbles and surface deformation may each cause overlay and printing errors resulting in defects. For more information on air curtain type immersion tools, see for example U.S. Patent publication 2005/0007569 or European Patent Applications EP 1 477 856 A1 and EP 1 420 298 A2, incorporated by reference herein for all purposes.

Another known way of maintaining the immersion fluid within the gap of a lithography tool is with the use of a nozzle that surrounds the last optical element immediately above the area to be exposed on the substrate. The nozzle includes one or more fluid inlets that introduce the immersion fluid into the gap. The nozzle may also include one or more porous members, pulling, for example, a vacuum below the "bubble point" of the porous material; through which the immersion fluid is recovered. For more information on nozzle type immersion lithography tools, see U.S. application Ser. No. 11/362,833, and PCT Application Serial Numbers. PCT/US2004/22915 and PCT/US2005/14200, all incorporated herein by reference for all purposes.

It is also known to maintain the immersion fluid in the gap between the last optical element and the imaging surface of the substrate by immersing both in a container filled with immersion fluid. The problem with this approach is that during stepping or scanning, the substrate table holding the substrate has to be moved, often at rapid speeds, causing the immersion fluid to "slosh" around within the container. The sloshing fluid causes the projection optical system to mechanically vibrate, inducing overlay and printing errors. Fluid may also be displaced from the container. See for example U.S. Pat. No. 4,509,852, also incorporated by reference herein.

With immersion lithography, any fluid droplets on the substrate are undesirable. If the droplets dry or evaporate on the substrate, any contaminants in the droplet, for example residues dissolved from the resist, remain deposited on the wafer. These deposits may cause printing errors. In addition, if droplets later join the main body of immersion fluid due to the movement of the substrate, the droplets could entrap air which can cause bubbles in the main body of the fluid.

SUMMARY

A lithography apparatus having a fluid confinement plate, which submerges the imaging surface of a substrate, is disclosed. The apparatus includes a stage configured to support the substrate. A projection optical system is provided to project an image defined by an imaging element onto the imaging surface of the substrate through a gap, filled with immersion fluid, between the imaging surface of the substrate and the last optical element of the projection optical system. The fluid confinement plate, which is positioned within the gap between the last optical element and the substrate, is sufficiently sized so that the imaging surface is submerged in the immersion fluid. The fluid confinement plate includes a first surface facing the gap and opposing the imaging surface of the substrate. The first surface includes a droplet control element to control the formation of droplets forming on the first surface. In one embodiment, the droplet control element is a porous surface formed on the first surface. A vacuum is used to pull any excess immersion fluid through the porous region to prevent the formation of droplets. In a second embodiment, the droplet control element is a sloped surface that causes any immersion fluid on the first surface to flow toward to main body of immersion fluid in the gap. Preventing the formation of droplets on the first surface is desirable for a number of reasons, including the prevention of contamination and printing errors if the droplet were to fall onto the substrate surface. Stray droplets may also interfere with the proper operation of, for example, the interferometers used by the lithography apparatus.

BRIEF DESCRIPTION OF THE DRAWINGS

Like reference numerals in the figures refer to like elements.

DETAILED DESCRIPTION

Figure 1:
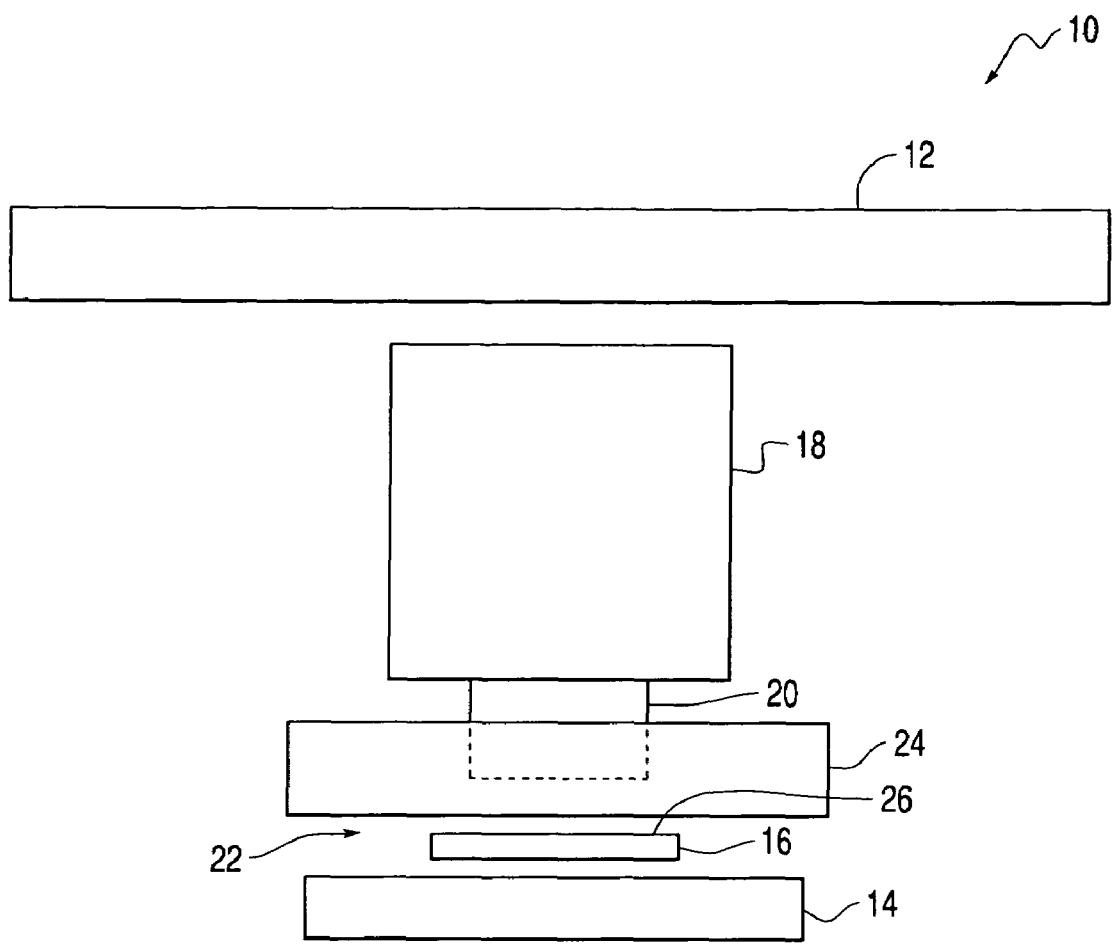
FIG. 1 is a diagram of a lithography tool having a fluid confinement plate according to the present invention.

Referring to FIG. 1, an immersion tool or apparatus is shown. The immersion apparatus 10 includes a stage 14 configured to support a substrate 16, and a projection optical system 18 configured to project an image defined by an imaging element 12 onto the substrate 16. The optical system 18 includes a "last" or "final" optical element 20. During the exposure of the substrate 16, a gap 22 is provided between the substrate 16 and the last optical element 20. A fluid confinement plate 24 is positioned at least partially within the gap 22 between the last optical element 20 and the substrate 16. The area of the gap 22 under the fluid confinement plate 24 is filled with an immersion fluid (not illustrated). The top or upper surface of the substrate 16 defines an imaging surface 26. In the embodiment as illustrated, the fluid confinement plate 24 submerges the entire imaging surface 26 of the substrate 16 under immersion fluid.

During operation, the stage 14 scans or steps the substrate 16 under the projection optical system 18 so that a selected target area on the imaging surface 26 is positioned under the last optical element 20. The projection optical system then exposes the image defined by the imaging element 12 onto the target area. The substrate 16 is then stepped or scanned to a new target area and then exposed again. This process is repeated over and over until the entire imaging surface 26 of the substrate 16 is exposed. With each exposure, the image is projected through the projection optical system 18 and the immersion fluid onto the imaging surface 26 of the substrate 16.

In one embodiment, the imaging element 12 is a reticle or mask. In other embodiments, the imaging element 12 is a programmable micro-mirror array capable of generating an image, such as described in U.S. Pat. Nos. 5,296,891, 5,523, 193, and PCT Application Nos. WO98/38597 and 98/330096, all incorporated herein by reference. In one embodiment, the stage 14 is a fine stage that is supported by a coarse stage (not shown). The fine stage is responsible for fine position adjustment of the substrate 16 in, depending on the design, anywhere from one to six degrees of freedom (x, y, z, θx, θy and θz). Similarly, the coarse stage is responsible for moving the substrate 16 on the fine stage 14 in one to six degrees of freedom. According to various embodiments, the fine stage 14 may be supported on the coarse stage by magnetic levitation, air bellows, pistons, vacuum, or springs, as are all well known in the art.

Figure 2:
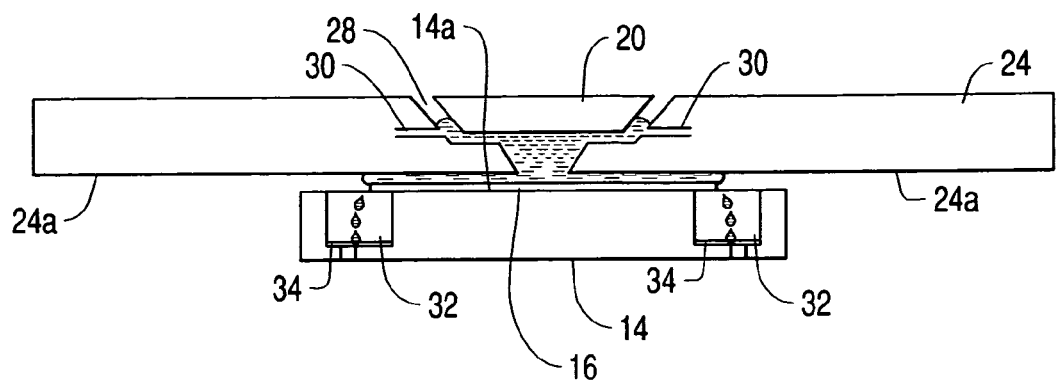
FIG. 2 is a cross section diagram of the fluid confinement plate in relation to a stage, a substrate supported by the stage and a last optical element of a projection optical system of the lithography tool of the present invention.

Referring to FIG. 2, a cross section diagram of the fluid confinement plate 24 in relation to the stage 14, substrate 16 and last optical element 20 is shown. As evident in the Figure, the substrate 16 is positioned on the stage 14 with the imaging surface 26 facing upward towards the last optical element 20 and the bottom surface 24a of the fluid confinement plate 24. In one embodiment, the bottom surface 24a of the fluid confinement plate 24 opposing the imaging surface 26 of the substrate 16 is made of or coated with a material that is hydrophobic or repellent to the immersion fluid. For example, on the bottom surface 24a, the immersion fluid has a static receding contact angle of greater than 70 degrees. The shaded areas in the figure designate the immersion fluid in the gap 22 and elsewhere.

The fluid confinement plate 24 includes an aperture 28, which is recessed shaped. The aperture 28 is designed to accommodate the last optical element 20 of the projection optical system 18 so that the image defined by the imaging element 12 can be projected through the aperture 28 of the plate 24 onto the substrate 16. The bottom surface 24a is disposed around the aperture 28. In this embodiment, the size of the end portion of the aperture 28 is smaller than that of the end surface of the last optical element 20. That is, in this embodiment, the end portion of the aperture 28 and a part of the fluid confinement plate 24 is disposed under the last optical element 20. In various other embodiments, the shape of the aperture 28 may vary as needed or desired. For example, the size of the bottom of the aperture 28 is larger than that of the end surface of the last optical element 20. In that case, the bottom surface 24a of the immersion fluid confinement plate 24 may be flush with the end surface of the optical element 20 or may be higher than the end surface of the optical element 20.

The fluid confinement plate 24 also includes one or more fluid inlets 30 for supplying immersion fluid from a reservoir (not shown) into the gap 22. In the embodiment illustrated, the inlets 30 are positioned adjacent to or surrounding the last optical element 20 positioned within the aperture 28. In this embodiment, during the exposure of the substrate 16, the immersion fluid from the fluid inlet 30 is supplied to a space between the end surface of the last optical element 20 and the part of the immersion fluid confinement plate 24, and then flows into a gap between the immersion fluid confinement plate 24 and the substrate 16 through the end portion of the aperture 28. In various other embodiments, the number of inlets 30 and their position may vary anywhere on the fluid confinement plate 24 as needed or desired. For example, one or more inlets may be arranged on the bottom surface 24a of the immersion fluid confinement plate 24.

The stage 14 also includes a fluid recovery element 32 that is provided adjacent a holding portion 14a configured to hold the substrate 16. In the embodiment illustrated, the fluid recovery element 32 is a reservoir that is a recess or a groove provided on the stage 14, and substantially surrounds the periphery of the substrate 16. The fluid recovery element recovers immersion fluid that overflows out from the gap between the substrate 16 and the immersion fluid confinement plate 24 when the substrate 16 is supported on the holding portion 14a of the stage 14. The size of the upper surface of the holding portion 14a is smaller than that of the back surface of the substrate 16. Therefore, the periphery of the substrate 16 held on the holding portion 14a is positioned above the recovery element 32, and immersion fluid that overflows out from the gap between the substrate 16 and the immersion fluid confinement plate 24 directly falls into the recovery element 32.

In other embodiments, the size of the upper surface of the holding portion 14a is the same or larger than that of the back surface of the substrate 16. In the first case, the recovery element 32 is immediately adjacent the edge of the substrate 16 in the stage 14. In the second case, a lateral space may be provided between the edge of the substrate and the recovery element 32 in the stage 14.

The fluid recovery element 32 may include a plurality of reservoirs arranged adjacent to the holding portion 14a of the stage 14. A vacuum system (not illustrated) may be used to provide negative pressure to collect and discharge the immersion fluid. At the bottom of the reservoir, one or more outlets connected to the vacuum system, are provided to discharge immersion fluid recovered in the reservoir defined as the fluid recovery element 32. During the exposure operation for the substrate 16, the vacuum system may be stopped. In that case, the vacuum system is operated, for example, after completion of the exposure operation.

The recovery element 32 may optionally include a porous element or surface 34 within the reservoir defined by the fluid recovery element 32. In one embodiment, the porous element 34 is substantially co-planar or flush with the top surface of the stage 14 which supports the substrate 16. The porous element 34 may be a mesh or a sponge, or the like. A vacuum (not illustrated) may be used to pull negative pressure through the porous element 34. The vacuum creates a negative pressure just below the bubble point of the porous element 34. "The bubble point" is a characteristic of the porous element 34 and is defined by the material of the porous element 34 and a size of the holes formed in the porous material 34. Maintaining negative pressure at or below the bubble point helps avoid the introduction of bubbles into the immersion fluid as well as mechanical noise or vibrations. In another embodiment, the porous element 34 can recover immersion fluid using a capillary force without the vacuum.

Figure 3:
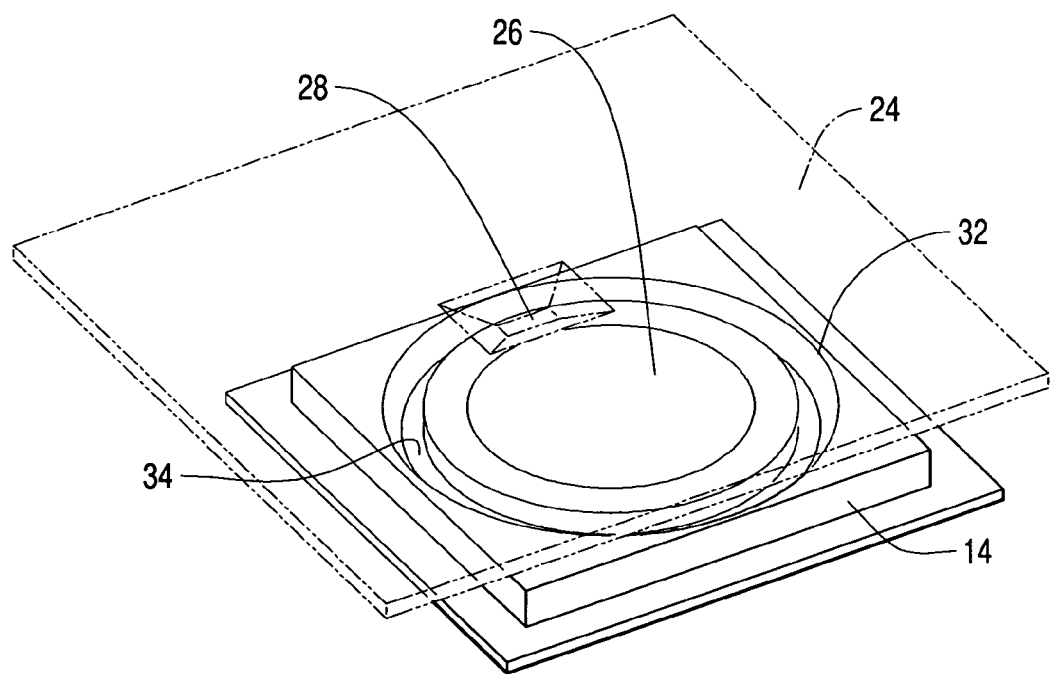
FIG. 3 is a perspective view of the imaging surface of the substrate supported by the stage in relationship to the fluid confinement plate of the lithography tool of the present invention.

Referring to FIG. 3, a perspective view of the imaging surface 26 of the substrate 16 supported by the stage 14 in relationship to the fluid confinement plate 24 is shown. The projection optical system 18, including the last optical element 20, has been purposely removed from the figure for the sake of clarity. As evident in the diagram, the stage 14 supports the substrate 16. The imaging surface 26 of the substrate is facing upward, opposing the bottom surface 24a of the fluid confinement plate 24. The reservoir shaped fluid recovery element 32 is provided around the periphery of the substrate 16. The aperture 28 is provided to allow the projection optics system 18 to project through the plate 24 onto the imaging surface 26 of the substrate.

In one embodiment, the rate of the immersion fluid introduced through the inlets 30 of the plate 24 is substantially the same as the rate of recovery by the recovery element 32. In this manner, the amount of fluid in the gap 22 is substantially constant.

In the embodiment as illustrated in FIGS. 2 and 3, the plate 24 is sufficiently large relative to the size of the substrate to ensure the imaging surface 26 is completely covered, regardless of the X and/or Y position of the stage 14 during an exposure operation. In other words, even when the stage 14 has moved the substrate 16 to its most extreme most X and/or Y position, the plate 24 is sufficiently large to make sure that the entire imaging surface 26 remains covered by the plate 24. For example, even when the periphery of the substrate 16 is positioned in a path of an imaging beam under the aperture 28 of the immersion fluid confinement plate 24, the entire imaging surface 26 of the substrate 16 is opposite to the bottom surface 24a of the plate 24, or the end surface of the last optical element 20, or both. As a general rule, the use of a large plate 24 typically means that the entire imaging surface 26 of the substrate 16 is submerged in the immersion fluid, which is filled in the gap between the imaging surface 26 of the substrate and the bottom surface 24a of the plate 24 and/or the last optical element 20. By submerging the entire imaging surface 26 of the substrate 16, a number of issues are avoided. Complete submersion eliminates an atmosphere-fluid meniscus from forming anywhere on the imaging surface 26 of the substrate 16, preventing droplets from forming on the substrate 16. Accordingly, the above-discussed printing and overly issues caused by contamination, evaporation, and localized deformation, due to droplet formation on the imaging surface, is avoided. It should be understood, however, that at certain times portions of the imaging surface 26 may not be entirely submerged due to the behavior of the fluid during stage acceleration, and/or issues with supplying or recovering the immersion fluid, and/or other circumstances.

In alternative embodiments, for example when the substrate 16 is a large flat panel display or a very large semiconductor wafer, it may not be practical for the make the plate 24 sufficiently large to cover the entire imaging surface at all times. In which case, the plate 24 should be made sufficiently large that a non-localized area beyond the specific imaging area should be submerged. This differs from so called "local fill" immersion lithography tools where the immersion fluids are contained just under or in the immediate vicinity of the last optical element 20. By substantially increasing the percentage of the area of the substrate submerged with immersion fluid, (e.g., 50% or more for a semiconductor wafer), the printing errors due to contamination, evaporation, and localized deformation can be reduced in relative terms compared to local fill systems.

Figure 4:
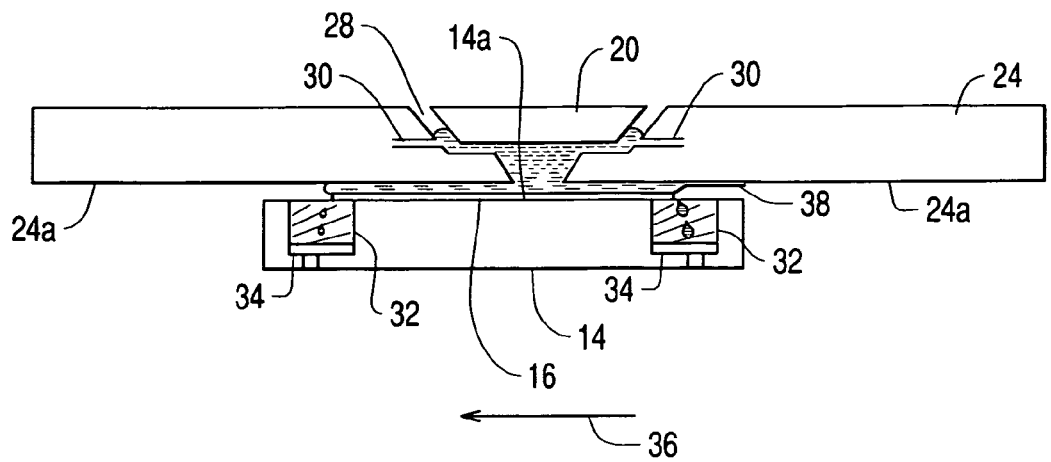
FIG. 4 is a diagram illustrating the behavior of the immersion fluid during motion of the stage carrying a substrate in the lithography tool of the present invention.

Referring to FIG. 4, a diagram illustrating the behavior of the immersion fluid under the immersion fluid confinement plate 24 during motion of the stage 14 is illustrated. In the figure, the stage 14 is scanning in a first direction, as designated by the direction arrow 36 (e.g., from right to left). As the stage 14 moves in one direction, a larger amount of immersion fluid will overflow out of the gap between the substrate 16 and the plate 24 at the trailing edge, as opposed to the leading edge. The fluid recover element 32 at the trailing edge will therefore typically collect more immersion fluid than the leading edge, as illustrated by the large droplets and small droplets falling into the fluid recovery element 32 at the trailing and leading edges respectively. When the stage 14 scans in the opposite direction (e.g., from left to right), the complement of above occurs.

During stage motion, a thin film of immersion fluid 38 may form on the bottom surface 24a of plate 24 in the trailing direction. If a relatively low surface tension immersion fluid is used, droplets may form on the surface 24a from the film 38. It is preferable that the immersion fluid be contained in the main body of fluid within the gap between the substrate 16, the last optical element 20, and the bottom surface 24a of the plate 24. If any immersion fluid escapes, it may be problematic for a number of reasons. The droplet may cause contamination and/or printing errors. Stray droplets could also interfere with the proper operation of the interferometers used by the lithography tool. Two embodiments described below and illustrated in FIGS. 5A and 5B provide a solution to prevent or alleviate the formation of droplets on the surface 24a of plate 24.

Figure 5A:
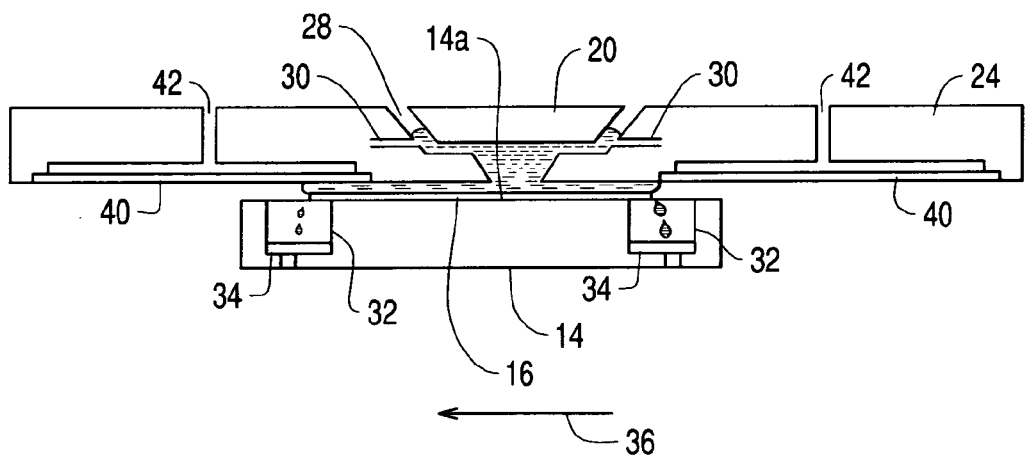
FIG. 5A is a diagram illustrating porous regions formed on the fluid confinement plate according to one embodiment of the present invention.

Referring to FIG. 5A, the fluid confinement plate 24 is modified to include porous regions 40 on the bottom surface 24a. Ducts 42 formed through the plate 24 are provided to couple a vacuum (not illustrated) to the porous regions 40. By using the vacuum to pull negative pressure through the porous regions 40, any immersion fluid forming on the bottom surface 24a of the plate 24 can be removed before any droplets are formed. In an alternative embodiment, the immersion fluid can be removed using capillary action through the ducts 42.

Figure 5B:
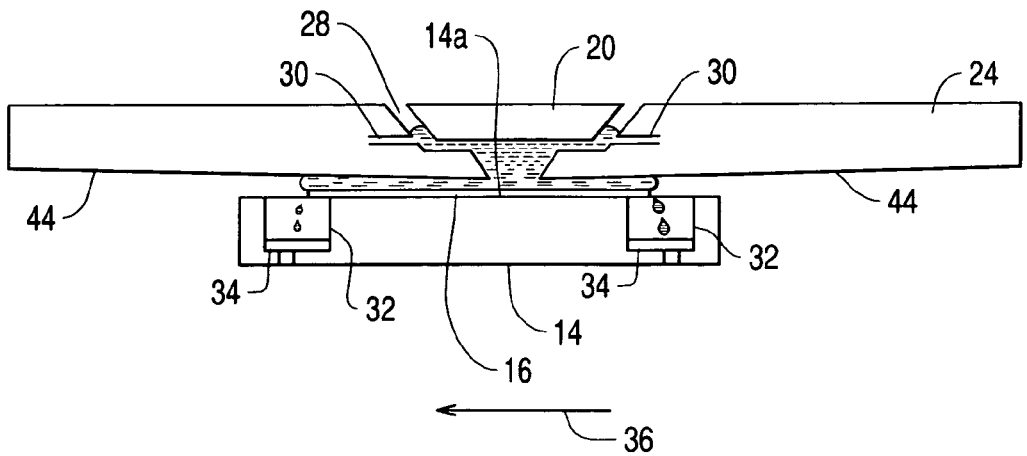
FIG. 5B is a diagram illustrating sloped regions formed on the fluid confinement plate according to another embodiment of the present invention.

Referring to FIG. 5B, the bottom surface 24a of the fluid confinement plate 24 is modified to include sloped regions 44. The sloped regions create a run off path so that any immersion fluid that has collected on the surface 24a can flow back to the main body of immersion fluid in the gap 22, preventing the formation of droplets.

In certain embodiments, the immersion fluid is a liquid having a high index of refraction. In different embodiment, the liquid may be pure water or a liquid including "Decalin" or "Perhydropyrene". In other embodiments, the immersion fluid can be a gas.

Figure 6A:
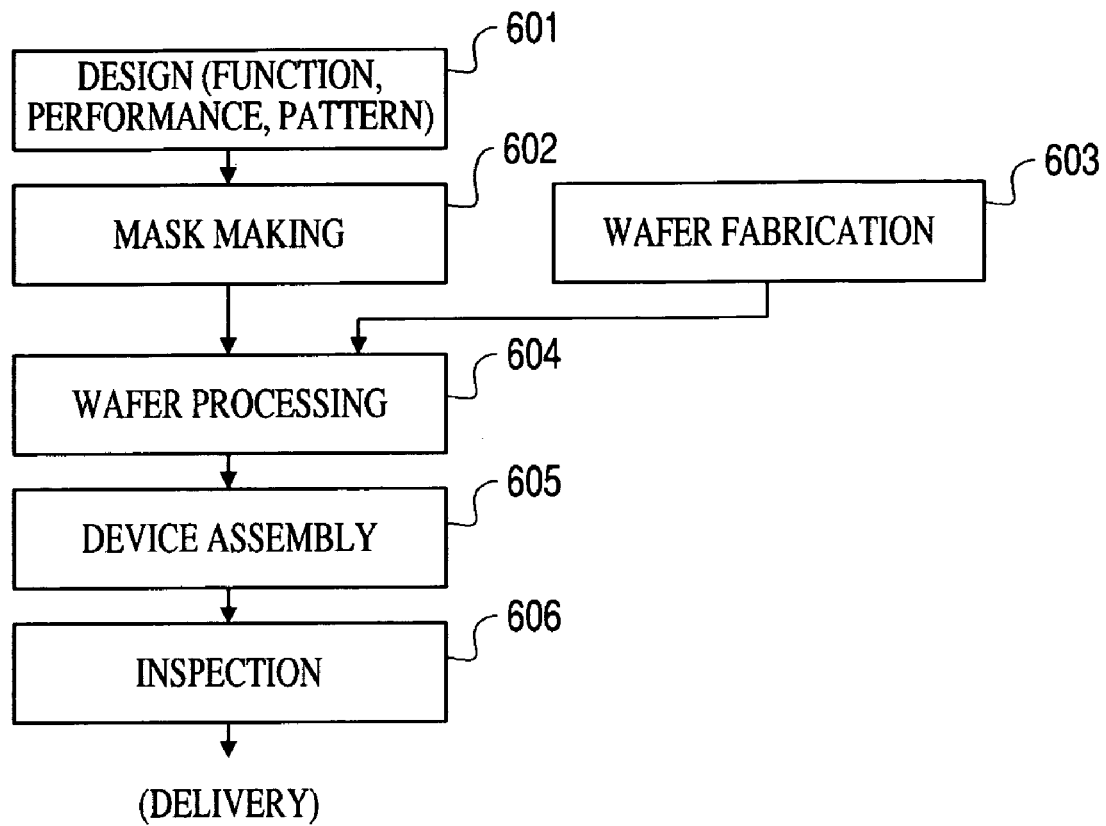
FIGS. 6A and 6B are flow diagrams illustrating the sequence of fabricating semiconductor wafers according to the present invention.

Semiconductor devices can be fabricated using the above described systems, by the process shown generally in FIG. 6A. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the present invention. In step 605 the semiconductor device is assembled (including the dicing process, bonding process and packaging process), finally, the device is then inspected in step 606.

Figure 6B:
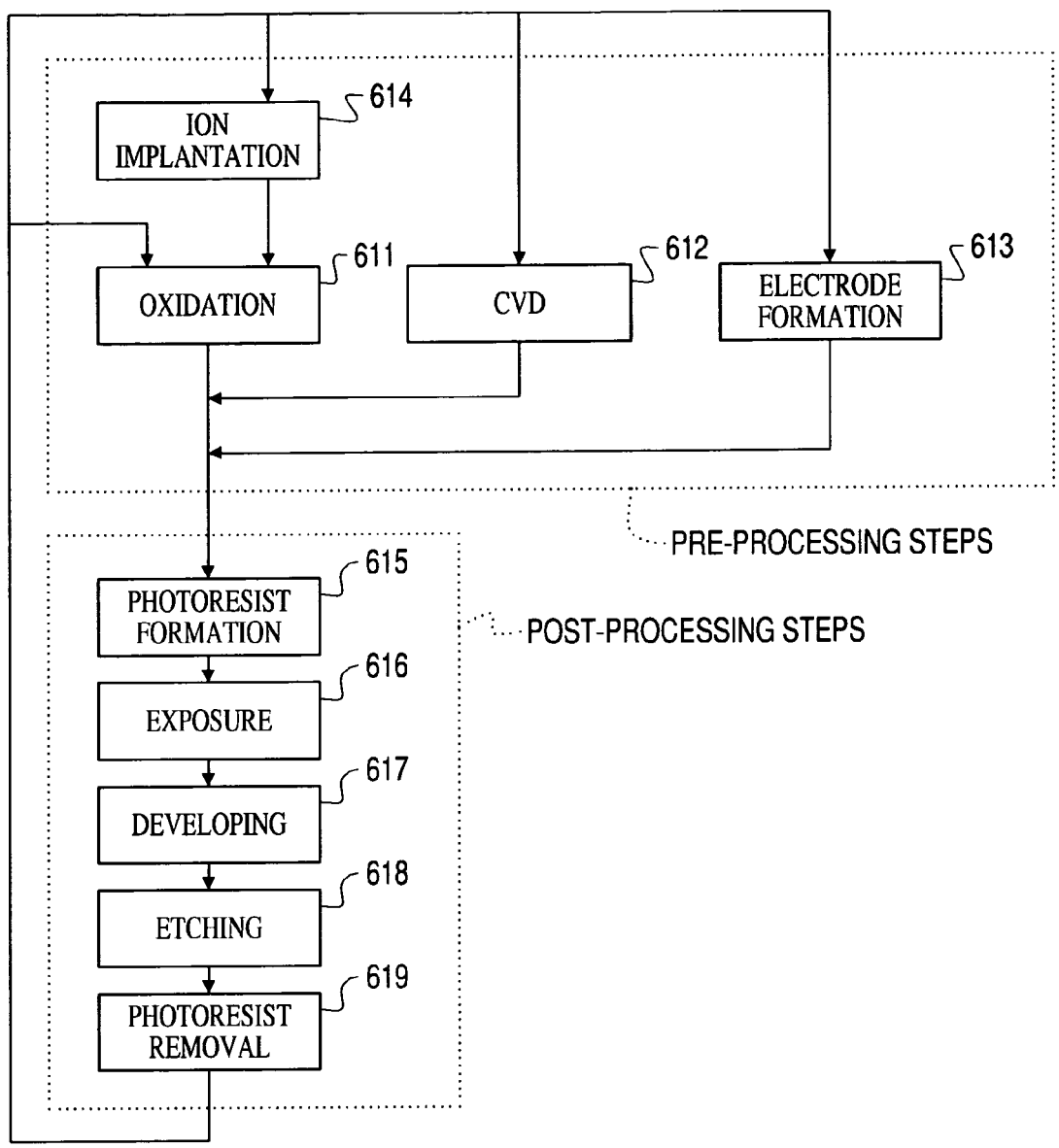

FIG. 6B illustrates a detailed flowchart example of the above-mentioned step 604 in the case of fabricating semiconductor devices. In FIG. 6B, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above-mentioned steps 611-614 form the preprocessing steps for wafers during wafer processing, and selection is made at each step according to processing requirements.

It should be noted that the particular embodiments described herein are merely illustrative and should not be construed as limiting. For example, the substrate described herein does not necessarily have to be a semiconductor wafer. It could also be a flat panel used for making flat panel displays. Rather, the true scope of the invention is determined by the scope of the accompanying claims.

What is claimed is:

1. An apparatus, comprising:
a stage which supports a substrate having an imaging surface;
a projection optical system having a last optical element, which projects an image onto the imaging surface of the substrate through an immersion liquid filled in a gap between the imaging surface of the substrate and the last optical element; and
a fluid confinement plate positioned adjacent to the imaging surface of the substrate so that the imaging surface is submerged in the immersion liquid, the fluid confinement plate is sufficiently large to cover an area larger than an area of the imaging surface of the substrate so as to completely submerge the imaging surface of the substrate, substantially preventing an atmosphere-liquid meniscus from forming on the imaging surface of the substrate,
the fluid confinement plate having a first surface opposing the imaging surface of the substrate, the first surface including a droplet control element to control the formation of droplets forming on the first surface.

2. The apparatus of claim 1, wherein the fluid confinement plate is sufficiently large to cover the entire substrate during scanning of the substrate by the stage.

3. The apparatus of claim 1, wherein the stage further comprises a fluid recovery element provided in the stage adjacent the substrate when the substrate is supported by the stage.

4. The apparatus of claim 3, wherein the fluid recovery element substantially surrounds the periphery of the substrate when the substrate is positioned on the stage.

5. The apparatus of claim 3, wherein the fluid recovery element further comprises a porous element provided in the stage, the porous element being connected to a vacuum source.

6. The apparatus of claim 1, wherein the fluid confinement plate further comprises one or more liquid inlets from which the immersion liquid is supplied into the gap.

7. The apparatus of claim 6, wherein the one or more liquid inlets are located adjacent the last optical element of the projection optical system.

8. The apparatus of claim 1, wherein the fluid confinement plate further comprises an aperture so that the projection optical system can project the image onto the imaging surface of the substrate through the fluid confinement plate.

9. The apparatus of claim 8, wherein the aperture is recessed shaped to accommodate at least the last optical element of the projection optical system.

10. The apparatus of claim 1, wherein the first surface of the fluid confinement plate is made of or coated with a hydrophobic material.

11. The apparatus of claim 1, wherein the droplet control element comprises a porous region formed on the first surface of the fluid confinement plate, whereby the porous region is used to recover immersion liquid that has collected onto the first surface to substantially prevent the formation of droplets of the immersion liquid on the first surface.

12. The apparatus of claim 11, wherein the porous region is connected to a vacuum source to recover the immersion liquid that has collected onto the first surface of the fluid confinement plate.

13. The apparatus of claim 1, wherein the droplet control element comprises a sloped region formed on the first surface of the fluid confinement plate, the sloped region being sufficiently sloped to create a run off surface for the immersion liquid collected on the first surface to flow toward the immersion liquid in the gap to substantially prevent the formation of droplets on the first surface.

14. The apparatus of claim 5, wherein the porous element is substantially planar with a surface of the stage used to support the substrate.

15. A liquid immersion exposure apparatus in which an imaging surface of a substrate is exposed to an exposure beam, the apparatus comprising:
  an optical element through which the exposure beam passes;
  a liquid confinement member having a surface;
  a holding member which holds the substrate and moves the substrate relative to the optical element and the liquid confinement member, the holding member being movable in a region so that the entire imaging surface of the substrate can be positioned into the path of the exposure beam; and
  a liquid recovery portion provided on the holding member, which recovers a liquid that comes out from a gap between the imaging surface of the substrate and the surface of the liquid confinement member;
  wherein the liquid confinement member is sufficiently large that the entire imaging surface of the substrate on the holding member is opposite to the surface of the liquid confinement member or the end surface of the optical element or both, an entire time while the holding member is moved within the entire region.

16. The apparatus of claim 15, wherein the liquid recovery portion is disposed adjacent to the substrate held on the holding member.

17. The apparatus of claim 15, wherein the liquid recovery portion is disposed below the substrate held on the holding member such that an undersurface of at least a peripheral portion of the substrate directly communicates with the liquid recovery portion.

18. The apparatus of claim 17, wherein the liquid recovery portion surrounds the substrate held on the holding member.

19. The apparatus of claim 17, wherein the liquid recovery portion has a porous material through which the liquid is recovered.

20. The apparatus of claim 15, wherein the liquid confinement member has a liquid supply passage from which the liquid is supplied.

21. The apparatus of claim 15, wherein the liquid confinement member has an aperture through which the exposure beam from the optical element passes, and the surface of the liquid confinement member is formed around the aperture of the liquid confinement member.

22. A device manufacturing method comprising:
  exposing a substrate through the optical element of the liquid immersion exposure apparatus according to claim 15; and
  developing the exposed substrate.

* * * * *

UNITED STATES PATENT AND TRADEMARK OFFICE
CERTIFICATE OF CORRECTION

PATENT NO.       : 7,532,309 B2                                          Page 1 of 1
APPLICATION NO.  : 11/523595
DATED            : May 12, 2009
INVENTOR(S)      : Alex Poon et al.

It is certified that error appears in the above-identified patent and that said Letters Patent is hereby corrected as shown below:

On the Title Pg. and Col. 1 lines 1-5, the Title should read:

Item (54) IMMERSION LITHOGRAPHY SYSTEM AND METHOD HAVING AN IMMERSION FLUID CONFINEMENT PLATE FOR SUBMERGING THE SUBSTRATE TO BE IMAGED IN IMMERSION FLUID Signed and Sealed this Fourteenth Day of July, 2009

JOHN DOLL
*Acting Director of the United States Patent and Trademark Office*